United States Patent
Cahalane et al.

(10) Patent No.: US 6,664,840 B2
(45) Date of Patent: Dec. 16, 2003

(54) OFFSET CALIBRATION SYSTEM AND METHOD FOR A HIGH GAIN SIGNAL CHANNEL

(75) Inventors: Aidan J. Cahalane, Dunmanway (IE); Simon Atkinson, Heathfield (GB)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/128,125

(22) Filed: Apr. 23, 2002

(65) Prior Publication Data

US 2003/0117205 A1 Jun. 26, 2003

Related U.S. Application Data

(60) Provisional application No. 60/342,223, filed on Dec. 20, 2001.

(51) Int. Cl.[7] ................................. H03L 5/00
(52) U.S. Cl. .............................. 327/307; 327/362
(58) Field of Search ............................ 327/307, 306, 327/167, 178, 361, 362, 378

(56) References Cited

U.S. PATENT DOCUMENTS

| | | | | |
|---|---|---|---|---|
| 5,319,679 A | * | 6/1994 | Bagby | 375/354 |
| 5,457,714 A | * | 10/1995 | Engel et al. | 375/247 |
| 5,459,679 A | | 10/1995 | Ziperovich | 364/602 |
| 5,761,251 A | | 6/1998 | Wender | 375/345 |
| 6,069,866 A | * | 5/2000 | Pietruszynski et al. | 369/124.11 |
| 6,166,668 A | | 12/2000 | Bautista et al. | 341/118 |
| 6,225,848 B1 | | 5/2001 | Tilley et al. | 327/307 |
| 6,317,064 B1 | | 11/2001 | Ferrer et al. | 341/118 |
| 6,493,404 B1 | * | 12/2002 | Iizuka et al. | 375/343 |

* cited by examiner

*Primary Examiner*—Kenneth B. Wells
*Assistant Examiner*—Cassandra Cox
(74) *Attorney, Agent, or Firm*—Samuels, Gauthier & Stevens, LLP

(57) ABSTRACT

A direct current offset correction system is disclosed for use in an analog signal processing system. The offset correction system includes a comparator unit for comparing the polarity of signals from an analog signal channel and producing a binary output signal. The system also includes a digital accumulator unit that is coupled to the comparator output signal for providing an accumulated average signal over a predetermined period of time. The system also includes a threshold corrective signal unit for determining whether the accumulated signal is within a defined threshold window of acceptable values. The system further includes a correction unit for applying a corrective signal to the analog signal channel.

28 Claims, 3 Drawing Sheets

OFFSET CALIBRATION SYSTEM AND METHOD FOR A HIGH GAIN SIGNAL CHANNEL

This application claims priority to U.S. Provisional Patent Application Ser. No. 60/342,223 filed Dec. 20, 2001.

BACKGROUND OF THE INVENTION

The invention generally relates to the field of electronic circuits, and particularly relates to the field of minimizing DC offsets in electronic circuits.

Conventional communication systems typically require relatively large gain to increase the amplitude of a relatively weak received signal. Direct current (DC) offsets may develop in such systems and even small DC offsets may saturate the signal path due to the large gain. For example, baseband filters may become saturated, compromising the performance of a receiver circuit. DC offsets may also be present in circuits due to component mismatches within a system filter and mismatches appearing directly at the filter input. Although capacitors may be used to couple components of a communication circuit, in some cases such capacitors may require a significant amount of silicon area in fabrication. A low frequency pole may also introduce undesired transient voltages that do not settle sufficiently quickly.

U.S. Pat. No. 6,225,848 discloses a conventional DC offset correction loop circuit that requires that the system input signal be removed from the input channel during offset calibration. In particular, the receiver portion of the circuit is first shut down by disabling either a low noise amplifier or a local oscillator to remove the system input signal, leaving any non-zero offset that may exist. The offset signal is amplified and the amplified offset signal is fed back to a sign bit generator where a sign bit is generated indicative of the sign of the offset voltage. The voltage is then changed by adjusting the input to a digital-to-analog converter (DAC). The routine is repeated until the offset is compensated to within the least significant bit of the DAC and the code in the DAC is then held while the signal is reintroduced into the channel. The offset calibration routine is disclosed to be run at system initialization and when the offset exceeds a threshold value.

In certain systems, it is desirable to correct for any offset during operation of a primary circuit without interruption. U.S. Pat. No. 6,166,668 discloses another offset correction circuit in which the output signal is provided in a digital form. This digital output is disclosed to be fed back to a digital accumulator that is coupled to a DAC via control logic to correct for any digital offset. Because of the finite resolution of the feedback DAC, there may be an offset residue in the channel. This residual offset may result in the digital accumulator alternating the DAC code above and below the desired correction point within one least significant bit of the DAC.

There is a need therefore, for an improved system for correcting for digital offset in an analog signal processing system, and in particular for an improved system for efficiently correcting for any digital offset without interruption of the processing of the analog signal.

SUMMARY OF THE INVENTION

The invention provides a direct current offset correction system for use in an analog signal processing system. The offset correction system includes a comparator unit for comparing the polarity of signals from an analog signal channel and producing a binary output signal. The system also includes a digital accumulator unit that is coupled to the comparator output signal for providing an accumulated average signal over a predetermined period of time. The system also includes a threshold corrective signal unit for determining whether the accumulated signal is within a defined threshold window of acceptable values. The system further includes a correction unit for applying a corrective current to the analog signal channel.

BRIEF DESCRIPTION OF THE DRAWINGS

The following description may be further understood with reference to the accompanying drawing in which.

Figure 1:
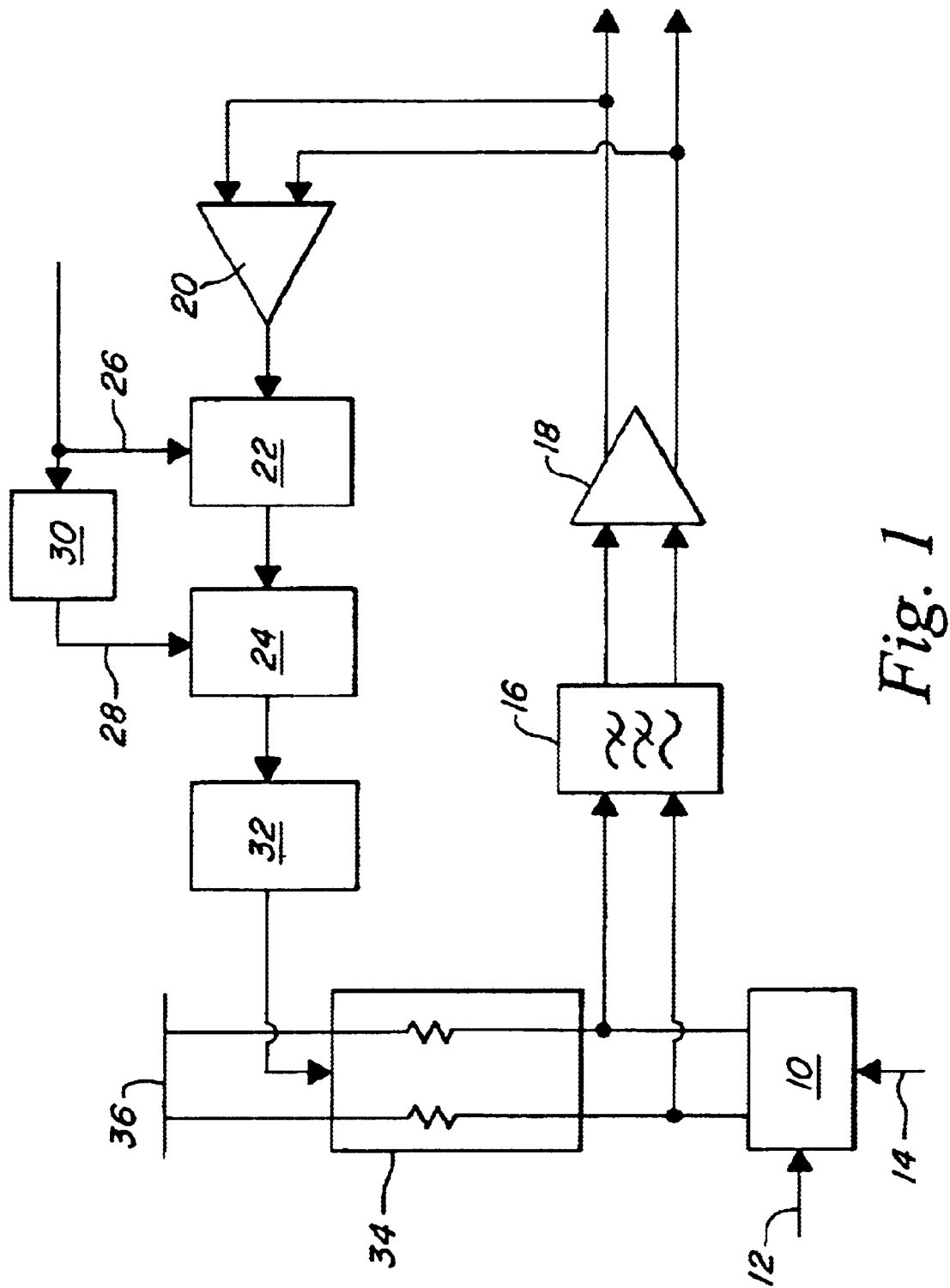
FIG. 1 shows an illustrative view of a system of the invention providing offset correction.

The drawing is shown for illustrative purposes.

DETAILED DESCRIPTION OF THE INVENTION

The invention provides an error correction circuit that may be employed during operation of the main circuit, e.g., a radio receiver or transmitter without interruption. In an embodiment, the invention includes a correction loop that operates by sampling a circuit output signal at a high rate. The difference between the sampled signal and a reference signal is determined and a polarity signal (e.g., +1 or −1) indicative of the polarity of the difference is stored in a digital counter. The sum of all of the polarity signals is accumulated in the digital counter over time as an accumulated polarity signal. Statistically, the accumulated polarity signal in the digital counter over the predetermined period of time should be the median of the two polarity signals (e.g., 0). A drift of the accumulated polarity signal in either the positive or negative direction with respect to the reference signal is indicative of the presence of DC offset in the circuit.

As shown in FIG. 1, an offset correction system in accordance with an embodiment of the invention may be used with a receiver in a radio frequency communication system. In particular, the system includes a mixer 10 that receives a radio frequency input 12, and a local oscillator input 14. The output of the mixer 10 provides the differential inputs to a low pass filter 16, the output of which is received by a programmable gain stage amplifier 18. The differential output of the amplifier 18 provides the system output for the communication system, and the output is fed back through a comparator 20 to a digital accumulate and divide unit 22. The system further includes a windowed digital comparator 24. A relatively fast clock signal 26 is provided to the unit 22 and a relatively slow clock signal 28 is provided to the digital comparator. The frequency of the fast clock may be, for example at least twice the maximum signal bandwidth of the analog channel (e.g., the output of the amplifier 18), and is preferably between 10 MHz and 15 MHz. The slow clock signal may be several factors of 100 smaller, and is preferably between 100 Hz and 150 Hz. The slow clock signal may be provided by passing the fast clock signal through a divider 30. The output of the unit 22 is coupled to an n bit digital-to-analog converter (DAC) 32, and the analog output of the DAC is used to adjust the DC voltage at the mixer load resistors 34, which are coupled to a power supply 36 and to the differential inputs to the low pass filter 16 as shown.

During operation, the offset correction loop samples the output of the amplifier 18 at a relatively high rate (e.g., 15 MHz). The two differential output signals are compared with one another, and the polarity of any difference between them is accumulated in the digital accumulator or counter. During a slow clock cycle, the signal is sampled many times by the comparator 20 at the fast clock rate (for example greater than 1000 times), and the accumulated sum of the polarity values is compared with zero. Any drift should be due to a DC content in the filter. If the digital accumulator drifts significantly in either non-zero direction, then the input to the DAC is incremented or decremented as required to correct for the offset.

The loop further includes the windowed digital comparator 24 between the output of the counter unit 22 and the input to the DAC 32. The windowed digital comparator is used to detect whether the DC energy over the time of the sample is within an acceptable window (i.e., above a low threshold and below a high threshold). This prevents the loop from alternating positive and negative corrections once the remaining offset is less than the least significant bit of the DAC. Further, the counter is reset with every slow clock cycle, which prevents the error from migrating out of the acceptable window.

Figure 2:
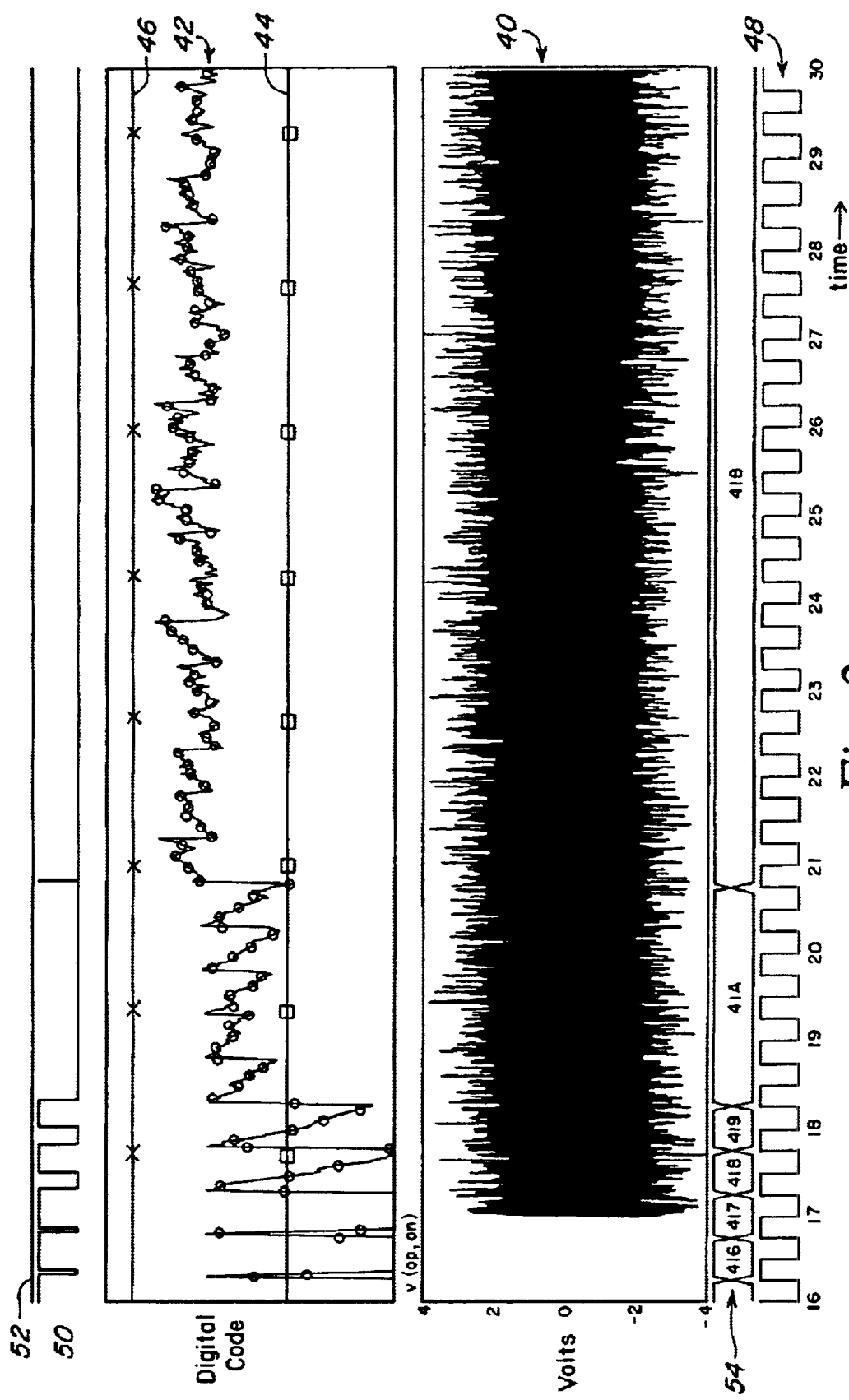
FIG. 2 shows an illustrative diagrammatic composite timing chart of certain parameters during a operation of a system of the invention.

FIG. 2 shows an illustrative diagrammatic composite timing chart of a system of the invention in which an offset present in the core filter 16 is compensated by the loop. The differential output of the amplifier 18 is shown at 40 and the output of the digital accumulator 22 is shown at 42. The threshold window is defined by a low threshold digital value as shown at 44 and a high threshold digital value as shown at 46. A slow clock signal is shown at 48 and during operation the output signal 40 is repeatedly sampled by comparator 20 during each clock cycle. The polarity of each sample is accumulated in the digital accumulator 22. At the end of each slow clock cycle a command is provided by the digital comparator 24 to either increase or decrease the DAC by one least significant bit (LSB) provided the value of the digital comparator has exceeded the threshold of the windowed digital comparator. The increase command signal is shown at 50 and the decrease command signal is shown at 52. The code that is input to the DAC (shown in hexadecimal at 54) is then either increased, decreased or not changed as appropriate. The accumulator output 42 is reset to mid-scale every slow clock cycle as may be seen by the sharp jump in the digital accumulator output signal 42 each time that the slow clock signal rises.

Figure 3:
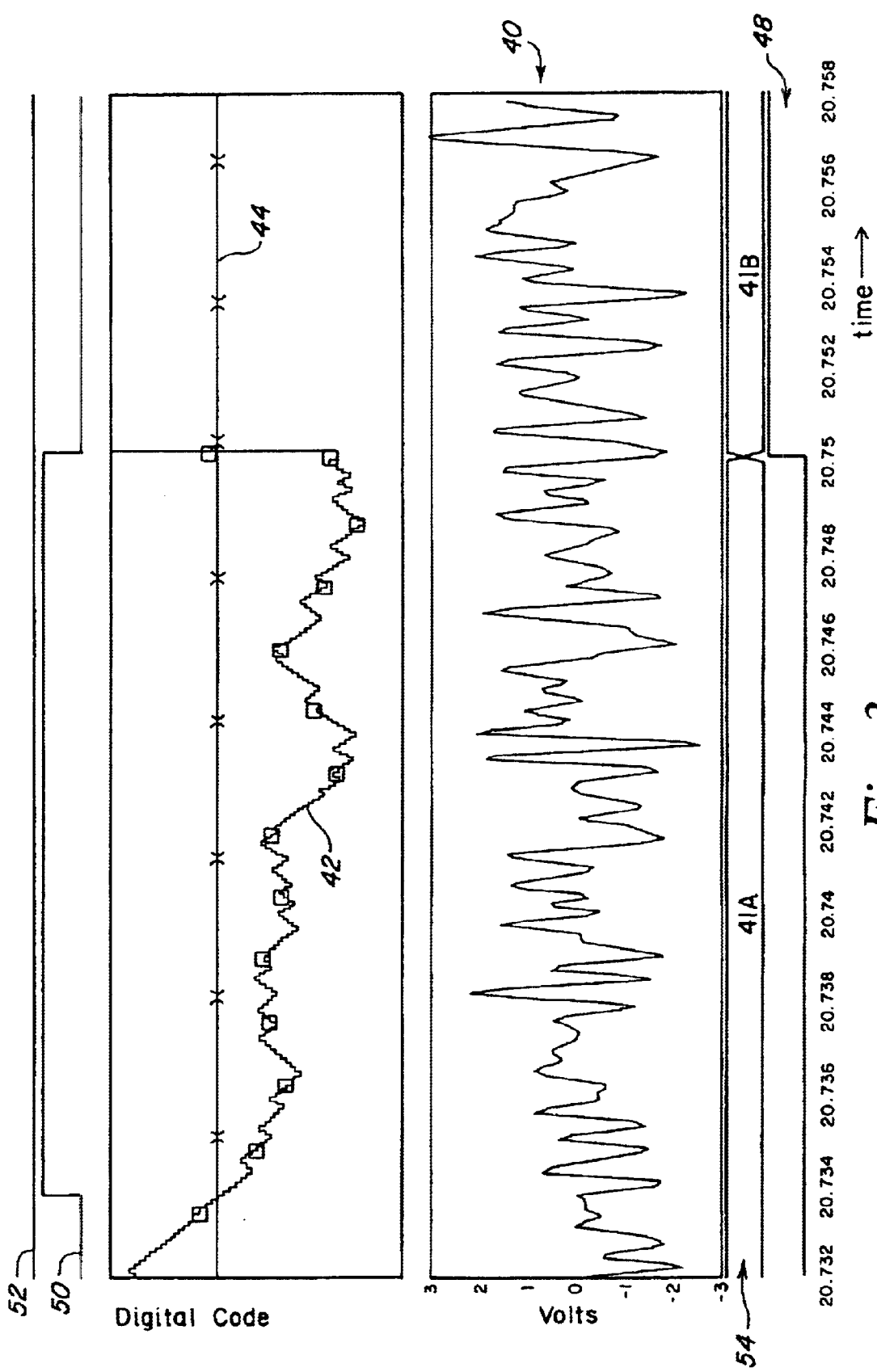
FIG. 3 shows a larger scale illustrative diagrammatic composite timing chart similar to FIG. 2 during operation of a system of the invention during a portion of a frame clock cycle.

FIG. 3 shows an illustrative diagrammatic composite timing chart of a system of the invention during a portion of a slow clock cycle. As shown in FIG. 3, during a portion of the slow clock cycle the signal shown at 40 is sampled many times and the accumulated offset signal 42 drifts below the low threshold 44. When this happens, the increase command signal 50 is enabled causing the DAC input to be increased from 41A to 41B in hexadecimal. Again, the accumulator is reset when the slow clock signal rises.

Those skilled in the art will appreciate that numerous modifications and variations may be made to the above disclosed embodiments without departing from the spirit and scope of the invention.

What is claimed is:

1. A direct current offset correction system for use in an analog signal processing system, said offset correction system comprising:

comparator means for comparing polarity of signals from an analog signal channel and producing a binary output signal;

digital accumulator means coupled to said comparator output signal and to a first clock signal for providing an accumulated average signal over a predetermined period of time;

threshold corrective signal means for determining whether said accumulated signal is within a defined threshold window of acceptable values; and correction means coupled to said threshold corrective signal means for applying a corrective current to said analog signal channel.

2. The offset correction system as claimed in claim 1, wherein said threshold corrective signal means is coupled to a second clock signal.

3. The offset correction system as claimed in claim 2, wherein said second clock signal is relatively slow compared to said first clock signal.

4. The offset correction system as claimed in claim 3, wherein said correction system further includes a divider for receiving said first clock signal and providing said second clock signal.

5. The offset correction system as claimed in claim 1, wherein said threshold corrective signal means includes a defined high threshold input digital value and a defined low threshold input digital value.

6. The offset correction system as claimed in claim 1, wherein said threshold corrective signal means provides a digital to analog converter output signal.

7. A direct current offset correction system for use in an analog signal processing system, said offset correction system comprising:

comparator means for comparing polarity of signals from an analog signal channel and producing a comparator binary output signal;

accumulator means coupled to said comparator output signal and to a first clock signal for providing an accumulated avenge signal over a predetermined period of time;

reset means for resetting the accumulator means; and correction means coupled to said accumulator means for applying a corrective signal to said analog signal channel.

8. The offset correction system as claimed in claim 7, wherein said offset correction system further includes threshold corrective signal means for determining whether said accumulated signal is within a defined window of acceptable values.

9. The offset correction system as claimed in claim 8, wherein said correction means is coupled to said accumulator means via said threshold corrective signal means.

10. The offset correction system as claimed in claim 8, wherein said threshold corrective signal means receives a second clock signal that is relatively stow compared to said first clock signal.

11. A direct current offset correction system for use in an analog signal processing system, said offset correction system comprising;

comparator means for comparing polarity of signals from an analog signal channel and producing a comparator output signal;

accumulator means coupled to said comparator output signal for providing an accumulated average signal over a predetermined period of time responsive to a clock signal from a first clock;

threshold corrective signal means coupled to a second clock signal that is relatively slow compared to said fast clock signal, said threshold corrective signal means for determining whether said accumulated signal is within a defined threshold window of acceptable values; and correction means coupled to said threshold corrective signal means for applying a corrective signal to said analog signal channel.

12. The offset correction system as claimed in claim 11, wherein said accumulator means is reset responsive to said second clock signal.

13. The offset correction system as claimed in claim 11, wherein said first clock signal has a frequency of at least twice a maximum signal bandwidth of the analog channel.

14. A method of correcting for direct current offset in an analog signal processing system, said method comprising the steps of:

a) receiving analog signals in an analog signal channel b) comparing each of said analog signals with a reference to determine whether a direct current offset exists and producing a comparator output signal;

c) providing a first clock signal at a first frequency;

d) accumulating a sum of comparator output signals over a predetermined period of time to determine an accumulated value; and e) applying a correction signal to the analog signal channel responsive to whether said accumulated value is outside of a window threshold.

15. The method of correcting for direct current offset as claimed in claim 14, wherein said method further includes the step of providing a second clock signal at a second frequency that is lower tan said first frequency.

16. The method of correcting for direct current offset as claimed in claim 14, wherein said method further includes the step of resetting an accumulator.

17. The method of correcting for direct current offset as claimed in claim 15, wherein said method further includes the step of dividing said first clock signal to provide said second clock signal.

18. The method of correcting for direct current offset as claimed in claim 15, wherein said first frequency is at least twice a maximum signal bandwidth of the analog channel.

19. The method of correcting for direct current offset as claimed in claim 15, wherein said first frequency is about 10 MHz and said second frequency is about 100 Hz.

20. The method of correcting for direct current offset as claimed in claim 15, wherein said method further includes the step of determining whether an average comparator signal is outside of the window threshold responsive to said second clock signal.

21. The offset correction system as claimed in claim 1, wherein said correction means includes a plurality of mixer load resistors that are coupled to a power supply and to said analog signal channel.

22. The offset correction system as claimed in claim 7, wherein said correction means includes a plurality of mixer load resistors that are coupled to a power supply and to said analog signal channel.

23. The offset correction system as claimed in claim 7, wherein said reset means is coupled to a second clock signal.

24. The offset correction system as claimed in claim 8, wherein said threshold corrective signal means includes a digital comparator.

25. The offset correction system as claimed in claim 8, wherein said threshold corrective signal means includes a digital to analog converter.

26. The offset correction system as claimed in claim 11, wherein said threshold corrective signal means includes a digital comparator.

27. The offset correction system as claimed in claim 11, wherein said threshold corrective signal means includes a digital to analog converter.

28. The offset correction system as claimed in claim 11, wherein said correction means includes a plurality of mixer load resistors that are coupled to a power supply and to said analog signal channel.

* * * * *